United States Patent [19]
Pennock

[11] Patent Number: 5,923,216
[45] Date of Patent: Jul. 13, 1999

[54] FREQUENCY SELECTIVE AMPLIFIER CIRCUIT

[75] Inventor: John Laurence Pennock, Edinburgh, United Kingdom

[73] Assignee: Seagate Technology, Inc., Scotts Valley, Calif.

[21] Appl. No.: 08/875,568

[22] PCT Filed: May 30, 1995

[86] PCT No.: PCT/GB95/01245

§ 371 Date: Oct. 20, 1997

§ 102(e) Date: Oct. 20, 1997

[87] PCT Pub. No.: WO96/23352

PCT Pub. Date: Aug. 1, 1996

[30] Foreign Application Priority Data

Jan. 27, 1995 [GB] United Kingdom .................... 9501624

[51] Int. Cl.[6] ................................ H03F 3/45; G11B 5/02
[52] U.S. Cl. ............................ 330/255; 330/306; 360/67
[58] Field of Search .............................. 330/69, 257, 255, 330/259, 302, 306; 360/67, 68

[56] References Cited

U.S. PATENT DOCUMENTS

| | | | |
|---|---|---|---|
| 4,843,342 | 6/1989 | Hester et al. | 330/257 |
| 5,122,915 | 6/1992 | Klein et al. | 360/113 |
| 5,204,789 | 4/1993 | Jove et al. | 360/67 |
| 5,258,723 | 11/1993 | Mazzucco et al. | 330/259 X |
| 5,293,136 | 3/1994 | Ryat | 330/258 |

FOREIGN PATENT DOCUMENTS

| | | |
|---|---|---|
| 2 080 649 | 2/1982 | United Kingdom . |
| 2 122 831 | 1/1984 | United Kingdom . |
| 2 198 307 | 6/1988 | United Kingdom . |

*Primary Examiner*—James B. Mullins
*Attorney, Agent, or Firm*—Flehr Hohbach Test Albritton & Herbert LLP

[57] ABSTRACT

An amplifier especially suitable for use as a reading-head amplifier in a disc drive employing a magnetoresistive sensor. The amplifier is capable of injecting a fixed current into the magnetoresistive sensor and of providing an output signal dependent on the voltage developed across the magnetoresistive sensor as the resistance of the sensor varies in accordance with its magnetic environment.

23 Claims, 5 Drawing Sheets

FREQUENCY SELECTIVE AMPLIFIER CIRCUIT

The invention relates to an amplifier especially suitable for use as a reading-head amplifier in a disc drive.

A first amplification stage, for a disc drive employing a magneto-resistive head, which is capable of operation with a supply voltage as low as 3.6 volts is described at pages 393 to 395 of IBM Technical Disclosure Bulletin, vol. 36, no. 3 of March 1993.

A first aspect of the invention is the provision of an amplifier including a current generator connected to one of its input ports for, in operation, injecting a current into a load which, in operation, is connected to the said input port of the amplifier, a frequency-selective amplifying circuit connected to the said input port, the frequency-selective amplifying circuit, in operation, amplifying input signals excluding the injected current present at the said input port and a voltage cancellation circuit connected within the frequency-selective amplifying circuit, the voltage cancellation circuit, in operation, opposing a condition of imbalance within the frequency-selective amplifying circuit attributable to the injected current, wherein the current generator includes a network of transistor current mirrors which, in operation, supply a first current to a first terminal and sink a second current at a second terminal of the input port, the first and second currents being unequal.

Preferably, the relative dimensions of the transistor current mirrors establish the current ratios existing in the network of transistor current mirrors.

Preferably, the network of transistor current mirrors includes a first transistor current mirror, a second transistor current mirror and a third transistor current mirror, the third transistor current mirror being connected to receive current from the first transistor current mirror, the second and third transistor current mirrors, in operation, providing the first and second currents.

Preferably, the voltage cancellation circuit is connected to respond, in operation, to a d.c. output voltage from the frequency-selective amplifying circuit and to apply a signal to an input element of the frequency-selective amplifying circuit in such a sense as to drive the d.c. output voltage of the frequency-selective amplifying circuit towards zero volts.

Preferably, the voltage cancellation circuit operates initially with a first bandwidth and a first gain and, subsequently, with a second bandwidth which is narrower than the first bandwidth and a second gain which is substantially equal to the first gain.

Preferably, the voltage cancellation circuit, in operation, responds to a first operating-voltage at a low level and a second operating-voltage at a high level in the frequency-selective amplifying circuit and applies a signal to an input element of the frequency-selective amplifying circuit in a sense such as to oppose a departure of the first and second operating voltages from selected values.

One embodiment of the voltage cancellation circuit includes a current-amplifier output stage which, in operation, maintains an input d.c. voltage at an input element of the frequency-selective amplifying circuit for opposing the effect of the injected current.

An alternative embodiment of the voltage cancellation circuit includes a voltage-amplifier output stage connected in series with a current-setting resistor for maintaining an input d.c. voltage at an input element of the frequency-selective amplifying circuit for, in operation, opposing the effect of the injected current.

Preferably, a capacitor is connected to a port of the voltage-cancellation circuit and determines the bandwidth of the voltage-cancellation circuit.

Preferably, the frequency-selective amplifying circuit includes a differentially-connected bipolar transistor input stage so connected as to operate in a common-base configuration over the frequency range of the frequency-selective amplifying circuit.

Preferably one transistor of the differentially-connected input stage is provided with a fixed base voltage bias and the base voltage bias of the opposing transistor of the differentially-connected input stage is provided by the voltage cancellation circuit.

In one embodiment, the differentially-connected input stage includes current-feedback circuits for increasing the base input impedances of the transistors.

In another embodiment, each part of the differentially-connected input stage includes an input Darlington-connected transistor.

A second aspect of the invention is the provision of a current amplifier including:

an input current-summing stage having a first low-impedance input port which is an input port of the current amplifier, a voltage-amplifying stage an input port of which is connected to an output port of the current-summing stage, a reference stage including an output port which is connected to a second low-impedance input port of the current-summing stage and an output stage which is connected to be driven by the voltage-amplifying stage, the output stage being connected in parallel with the reference stage, the output currents of the output and reference stages being in a fixed ratio to each other as determined by the elements of the output stage and the reference stage.

The current-summing stage provides an output current equal to the sum of its input currents.

One embodiment of the current amplifier includes a resistor connected from an output port of the voltage-amplifying stage to a reference point defining the transresistance of the current amplifier.

An alternative embodiment of the current amplifier includes a second resistor connected from an output port of the voltage-amplifying stage to a further low-impedance input port of the current-summing stage defining the transresistance of the current amplifier.

In one embodiment, the current amplifier includes a first output stage with a first current gain and a second output stage with input and output ports connectible in parallel with respective input and output ports of the first output stage by means of switch elements, the second output stage having a current gain exceeding that of the first stage.

In another embodiment, the current amplifier includes the second resistor connectible by switch elements between the second output stage and the further low impedance input port of the current-summing stage when the second output stage is in operation, the values of the resistors being such as to maintain the same transresistance of the current amplifier when the second output stage is in operation.

Preferably, the reference and output stages include respective pairs of field-effect transistors, connected in push-pull, so coupled to the voltage-amplifying stage as to be biassed in class AB.

Preferably, the voltage-amplifying stage includes a further complementary pair of field-effect transistors with gate terminals connected to the respective gate terminals of the transistors in the reference and output stages and source terminals connected to the respective source terminals of the transistors in the reference and output stages.

Preferably, the voltage-amplifying stage includes an input voltage buffer connected to drive current into a network of field-effect transistors including the further complementary pair of field-effect transistors.

Preferably, the input buffer includes an input bipolar transistor connected as an emitter follower for driving current into the network of field effect transistors.

Alternatively, the input buffer can include an input field-effect transistor connected as a source follower for driving current into the network of field-effect transistors.

Preferably, the current amplifier includes an additional complementary pair of output field effect transistors with gate terminals connectible to the respective gate terminals of field-effect transistors included in the reference stage and source terminals connected to the respective source terminals of the field effect transistors included in the reference stage, for providing an output current exceeding that available from the first output stage.

Preferably, the field effect transistors are enhancement mode devices.

An amplifier in accordance with the first aspect of the invention and a current amplifier in accordance with the second aspect of the invention will now be described, by way of example only, with reference to the accompanying drawings in which.

Figure 1:
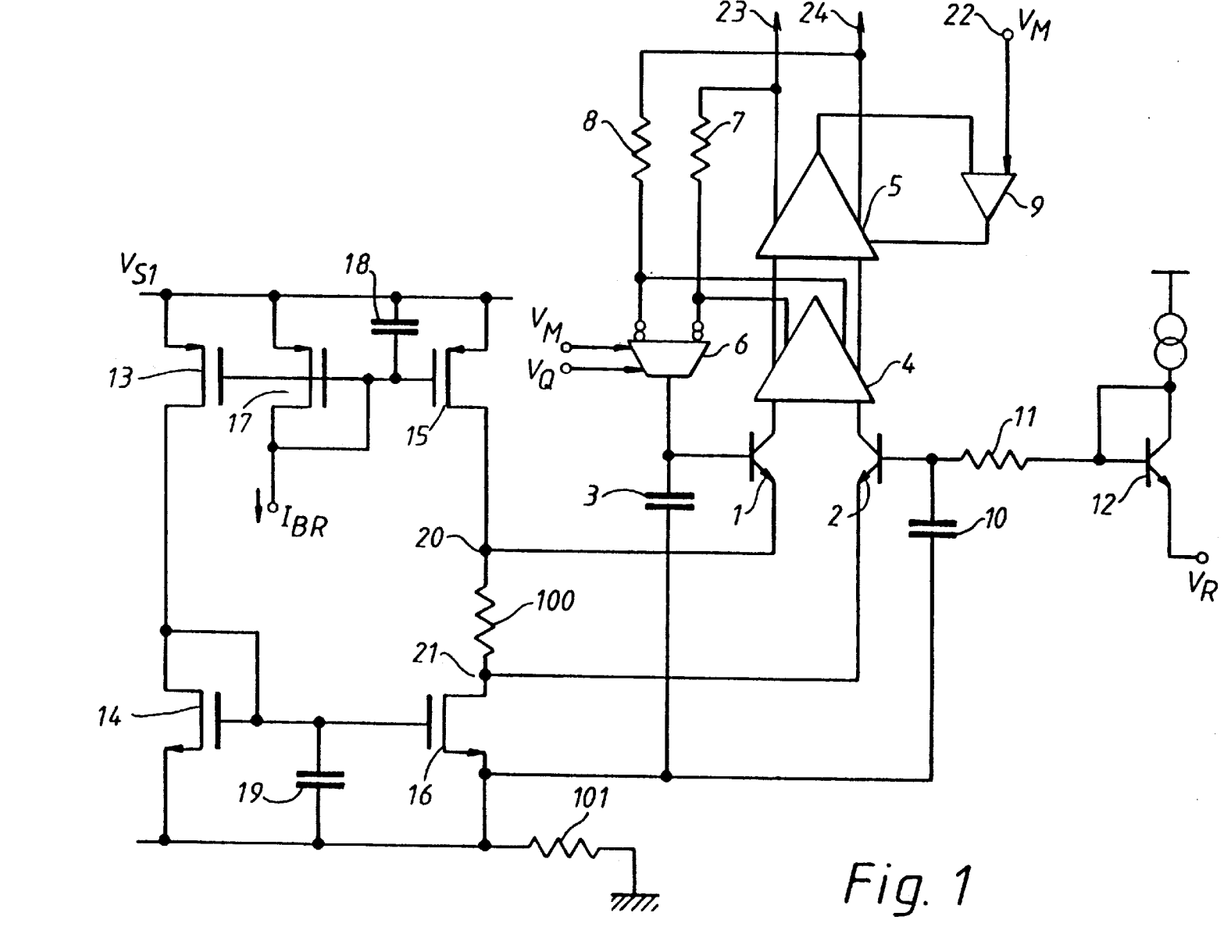
FIG. 1 is a diagrammatic representation of the amplifier.

Referring to FIG. 1 of the accompanying drawings, the amplifier includes two NPN bipolar transistors 1,2 the emitter electrodes of which are connected to respective input terminals 20,21 providing an input port of the amplifier for which the transistors 1,2 provide an input stage. The input terminals 20,21 are connected to a current generator circuit including first, second and third P-channel enhancement mode field effect transistors 13,15,17, first and second N-channel enhancement mode field effect transistors 14,16, a first capacitor 18 and a second capacitor 19.

In the current generator, the source electrodes of the transistors 13,15,17 are connected together and to a first terminal of a voltage source, the gate electrodes of the transistors 13,15,17 are connected together and to the drain electrode of the transistor 17. Further, the source electrodes of the transistors 14,16 are connected together and through a nominal parasitic series impedance represented by a resistor 101 to a second terminal (of voltage lower than that provided at the first terminal) of the voltage source, the gate electrodes of the transistors 14,16 are connected together and to the drain electrode of the transistor 14. The drain electrode of the transistor 14 is connected to the drain electrode of the transistor 13, the drain electrode of the transistor 15 is connected to the input terminal 20, the drain electrode of the transistor 16 is connected to the input terminal 21, the first capacitor 18 is connected between the source and gate electrodes of the transistors 13,15,17 while the second capacitor 19 is connected between the source and gate electrodes of the transistors 14,16 and the drain electrode of the transistor 17 is connected to an adjustable current sink.

The transistors 1,2 form the input elements of a frequency-selective amplifying circuit, the base electrode of the transistor 1 being connected to one terminal of a capacitor 3 the other terminal of which is connected to the source electrodes of the transistors 14,16. The collector electrode of the transistor 1 is connected to a first input terminal of an intermediate amplifying circuit 4 a first output terminal of which is connected to a first input terminal of an output voltage amplifying circuit 5, a first output terminal of the output voltage amplifying circuit 5 providing a first output terminal 23 of the amplifier. The collector electrode of the transistor 2 is connected to a second input terminal of the intermediate amplifying circuit 4 a second output terminal of which is connected to a second input terminal of the output voltage amplifying circuit 5, a second output terminal of the output voltage amplifying circuit 5 providing a second output terminal 24 of the amplifier. The base electrode of the transistor 2 is connected to one terminal of a capacitor 10 the other terminal of which is connected to the source electrodes of the transistors 14,16. A resistor 11 is connected between the base electrodes of the transistor 2 and the base electrode of an NPN bipolar transistor 12 which has its emitter electrode connected to a voltage reference source, there being a current source in the collector circuit of the transistor 12 which has a connection between its collector and base electrodes.

The base electrode of the transistor 1 is connected to the output port of a voltage cancellation circuit 6 which has first and second input terminals connected to respective third and fourth output terminals of the collector voltage amplifying circuit 4. The first input terminal of the voltage cancellation circuit 6 is connected to the first output terminal of the output voltage amplifying circuit 5 by way of a resistor 7. The second input terminal of the voltage cancellation circuit 6 is connected to the second output terminal of the output voltage amplifying circuit 5 by way of a resistor 8. A third output terminal of the output voltage amplifying circuit 5 is connected to a first input terminal of a common-mode correction amplifier 9 which has a second input terminal connected to a target reference voltage source providing a voltage $V_M$ and an output terminal connected to a further input terminal of the output voltage amplifying circuit 5. The value of $V_M$ is the nominal common-mode output voltage of the output voltage amplifying circuit 5. The voltage $V_M$ is applied to another input terminal of the voltage cancellation circuit 6 and a voltage $V_Q$ is applied to yet another input terminal of the voltage cancellation circuit 6. The voltage $V_Q$ is the estimated voltage for the base electrode of the transistor 1.

FIG. 1 shows a resistive element 100 connected between the input terminals 1,2 of the amplifier. The resistive element 100 represents a magnetoresistive element that may be included in the reading head of a magnetic-disc drive used in a computer, say. In the operation of a disc drive including the magnetoresistive element 100, the resistance of the magnetoresistive element varies in accordance with the magnetic signature of a disc over which a reading head containing the magnetoresistive element 100 is being guided. Current injected by the current generator connected to the input terminals 20,21 gives rise to a d.c. voltage across the magnetoresistive element 100. The magnetically-induced variation of the resistance of the magnetoresistive element 100 gives rise to an a.c. modulation of the voltage across the terminals 20,21 of the amplifier. The magnetoresistive element 100 is not a part of the amplifier.

The current generator included in FIG. 1 serves to provide a bias current for the resistive element 100 and equal bias currents for the transistors 1,2. A control current $I_{BR}$ is drawn from the drain electrode of the transistor 17 and an effect of the arrangement of the transistor 15 relative to the transistor 17 is to make a current of 32 $I_{BR}$–$I_E$ available from the drain electrode of the transistor 15 to the terminal 20, $I_E$ being the emitter bias current of each of the transistors 1,2. An effect of the arrangement of the transistors 13,14,16 relative to the transistor 17 is to make the transistor 16 capable of drawing a current of 32 $I_{BR}$+$I_E$ at its drain electrode. For example, if $I_{BR}$=15/32 mA and $I_E$=3.2 mA, the transistor 16 sinks a current of 18.2 ma, the transistor 15 supplies a current of 11.8 ma, each of the transistors 1,2 has an emitter bias current of 3.2 mA and a current of 15 ma flows through the magnetoresistive element 100. The current ratios existing among the transistors 13 to 17 are established principally by their relative dimensions. Currents resulting from mismatch between the transistors 13 to 17 are absorbed equally by the bias currents of the transistors 1,2.

The capacitors 18,19 included in the current generator circuit serve to attenuate pass-band noise components of the source and sink bias currents. Regulation of the voltage supply to the current generator circuit serves to reduce the amount of pass-band noise that would be contributed by the current generator circuit. The generation of spurious signals is further reduced by connecting the capacitor 19 directly to the source electrodes of the transistors 14,16 thereby avoiding the possible influence of lead-to-earth series impedance represented diagrammatically by the element 101.

The d.c. voltage present at the terminal 21 is set by the base electrode components of the transistor 2, the emitter electrode of the transistor 12 being connected to a reference voltage $V_R$. That results in the base electrode voltage of the transistor 12 being $V_R$+$V_{BE}$, where $V_{BE}$ is the voltage drop across the base-emitter junction of the transistor 12, and the base electrode voltage of the transistor 2, also, being $V_R$+$V_{BE}$. In practice $V_R$ is set at about 250 mV resulting in substantially the same d.c. voltage at the terminal 21.

The voltage cancellation circuit 6 acts on the transistor 1 to so control its d.c. base voltage and current as to maintain its d.c. emitter current substantially equal to the d.c. emitter current of the transistor 2 despite the fact that the d.c. emitter voltage of the transistor 1 must exceed that of the transistor 2 by an amount equal to the d.c. voltage drop across the resistive element 100.

The voltage cancellation circuit 6 receives input signals directly from the intermediate amplifying circuit 4 and by way of the resistors 7,8 from the output voltage amplifying circuit 5. The output signals from the voltage cancellation circuit 6 are applied to the base electrode of the transistor 1 and to the capacitor 3 which permits d.c. signals to pass substantially unattenuated to the base electrode of the transistor 1. The voltage cancellation circuit 6 is such that the capacitor 3 is maintained at a d.c. level which is consistent with substantially zero output voltages from the intermediate amplifying circuit 4 and the output voltage amplifying circuit 5. That is, the voltage cancellation circuit 6 acts to balance out the d.c. voltage generated between the terminals 20,21.

The bandwidth over which voltage balance is achieved is determined by the capacitance of the capacitor 3 in conjunction with an open-loop transconductance taking account of the current injected into the capacitor 3 by a loop starting at the base electrode of the transistor 1 through the intermediate amplifying circuit 4 and the voltage cancellation circuit 6. Signals within the bandwith (typically d.c. to 100 KHZ) are nulled out and do not appear at the output amplifying circuit 5. Signals outside the bandwidth, that is, above 100 KHZ are not cancelled and appear in the output from the output amplifying circuit 5.

The input impedance seen at the base of the transistors 1,2 may be increased by providing shunt-current feedback to the base electrodes of the transistors 1,2, or by providing base-current reduction circuits for those transistors in order to reduce the shunting effect of the base-input impedances of the transistors 1,2 on the capacitors 3,10.

The transistors 1,2 act as a differential common-base stage and pass-band signal current passes through them to respective load resistors (not shown) by way of the intermediate amplifying circuit 4 which serves as a buffer and shifts the d.c. voltage level of the output signal applied to the output amplifying circuit 5. The common-mode output voltage from the output amplifying circuit 5 is developed and applied to a first input terminal of a common-mode correction amplifier 9 which has a reference voltage $V_M$ applied to another input terminal. The output signal from the common-mode correction amplifier 9 is applied to an input stage of the output amplifying circuit 5 and forces the output amplifying circuit 5 to provide a voltage equal to $V_M$ at the first input terminal of the common-mode correction amplifier 9. The common-mode correction amplifier 9 is a conventional voltage amplifier.

The overall feedback provided by the voltage cancellation circuit 6 sets the bias currents of the transistors 1,2 and influences the low-frequency cut-off for the amplifier while its high-frequency cut-off is determined by the poles of the intermediate amplifying circuit 4 and the output amplifying circuit 5.

Both input terminals of the voltage cancellation circuit 6 are of low input impedance (current-input) and are both biassed internally to a voltage $V_M$ applied to the voltage cancellation circuit 6. The value of $V_M$ is the nominal common-mode output voltage of the output voltage amplifying circuit 5.

The quiescent output voltage (at zero net input current) of the voltage cancellation circuit 6 is set to a bias voltage VQ representing the voltage expected at the node 20 for nominal values of the resistance of the resistive element 100 and the current supplied to it. The bias voltage VQ is applied to an input terminal of the voltage cancellation circuit 6.

The voltage cancellation circuit 6 serves, further, to oppose departures from nominal of the voltage at the node 20 as a result of variation in the values of the resistive element 100 (due to manufacturing tolerances and temperature variations, for example) which would otherwise be amplified and cause clipping in the output circuit 5.

The voltage cancellation circuit 6 is a current-input current-output amplifier and its current gain can be switched between a low-gain (X1) and a high-gain (X50) state. The voltage cancellation circuit 6 operates in the high-gain state, at turn-on, in order that the operating point of the transistor 1 is stabilised rapidly. Its output impedance is also switched in order that its transresistance remains constant. The low-frequency cut-off changes between 100 kHz and 5 MHz, say, as the gain changes between X1 and about X50, its low-frequency loop gain remains substantially constant as switching occurs between the two conditions and there is substantially no output voltage transient on the subsequent change from high to low gain. The switching arrangement is described below, in more detail.

The intermediate amplifying circuit 4 provides a relatively low level of current drive to the voltage cancellation circuit 6 while the output amplifying circuit 5 provides a relatively high level of drive to the voltage cancellation circuit 6. In conditions, for example, at turn-on, that drive the signal from the output amplifying circuit 5 to its limit, the intermediate amplifying circuit 4 continues to provide variable drive to the voltage cancellation circuit 6 to improve large-signal response.

An alternative arrangement for a voltage cancellation circuit is a voltage amplifier having its input terminals connected directly to the output port of the output amplifying circuit 5 and its output terminal connected by way of a current-setting resistor to the capacitor 3. In the alternative arrangement, the output signal from the intermediate amplifying circuit 4 could be converted to a voltage and added to the input signal of the voltage amplifier.

Figure 2:
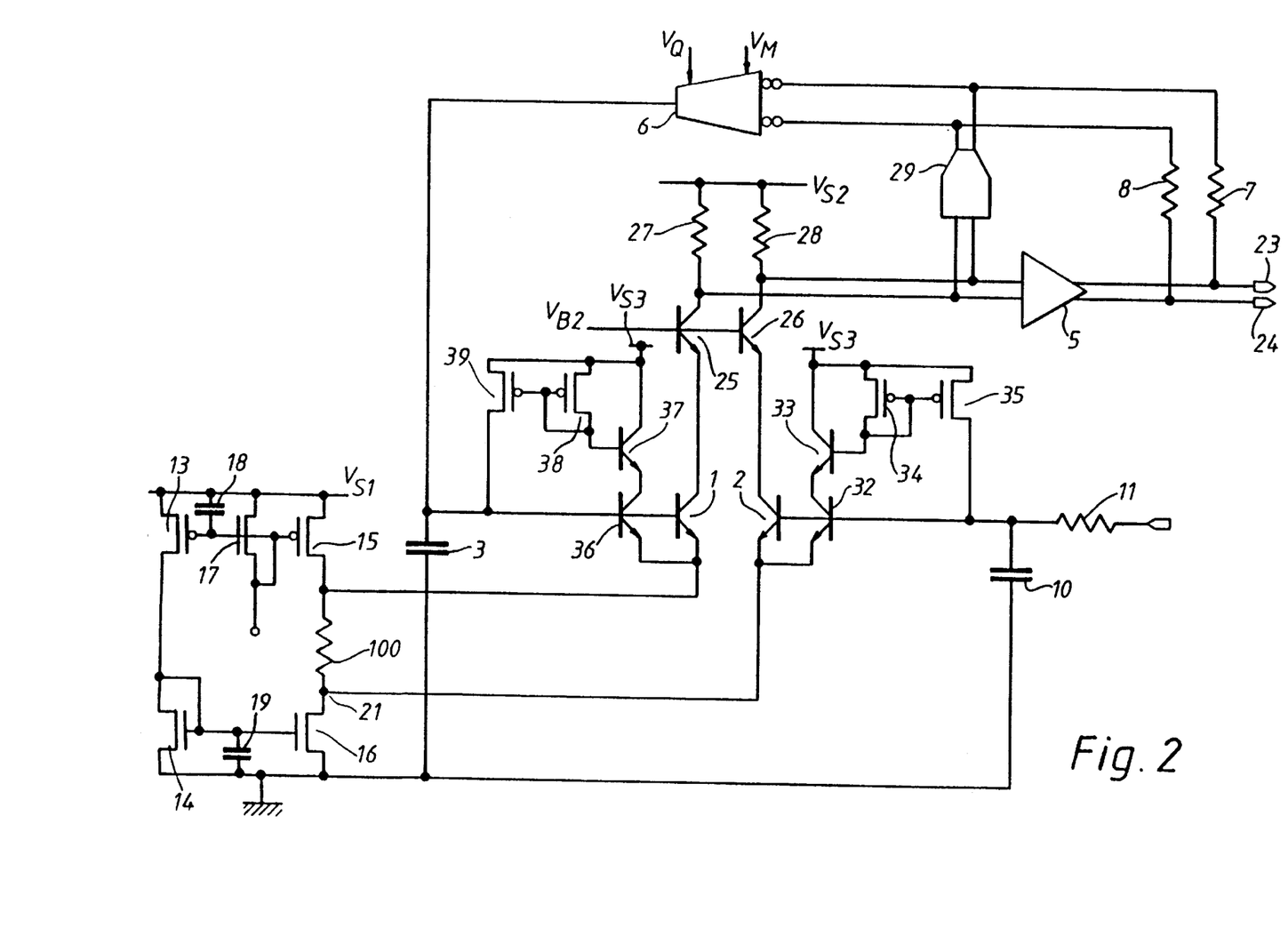
FIG. 2 is a diagrammatic representation of the amplifier showing it in more detail than is shown in FIG. 1.

Referring to FIG. 2 of the accompanying drawings, the intermediate amplifying circuit 4 of FIG. 1 is shown as including NPN bipolar transistors 25,26 connected in series with resistors 27,28 as the collector loads of the transistors 1,2, respectively, and a voltage-to-current converter 29, the bases of the transistors 25,26 being held at a bias voltage $V_{B2}$. For simplicity, the common mode correction amplifier 9 and the parasitic series impedance 101 of FIG. 1 are not shown in FIG. 2.

FIG. 2 shows an arrangement providing shunt-current-feedback to the transistor 2 in the form of NPN bipolar transistors 32,33 and P-channel enhancement mode field effect transistors 34,35. As shown, the gate electrodes of the transistors 34,35 are connected together as are the source electrodes of those transistors, the gate electrode of the transistor 34 is connected to its drain electrode and to the base electrode of the transistor 33, the emitter electrode of the transistor 33 is connected to the collector electrode of the transistor 32, the base electrode of the transistor 32 is connected to the base electrode of the transistor 2 and to the drain electrode of the transistor 35, the emitter electrodes of the transistors 2,32 are connected together and, finally, the collector electrode of the transistor 33 is connected to the source electrodes of the transistors 34,35 and to a positive terminal of a voltage source $V_{S3}$.

The base-emitter junction of the transistor 32 is connected in parallel with the base-emitter junction of the transistor 2 and the transistor 32 responds to an increase in the base-emitter voltage of the transistor 2 by drawing increased current through the emitter electrode of the transistor 33. The increase in the emitter current of the transistor 33 results in an increase in its base current, that leads to a fall in the gate voltages of the transistors 34,35 and the end result is increased current flow from the drain electrode of the transistor 35 into the base electrode of the transistor 2. The emitter areas of the transistors 32,33 are each a quarter of that of the transistor 2 and their collector and base currents are thus a quarter of the collector and base currents of the transistor 2. The transistors 34,35 serve as multiplier current-mirrors of the base current of the transistor 33 and the transistor 35 generates a current 5/4 of the base current of the transistor 2, that current being equal to the base current of the transistor 2 plus the base current of the transistor 32. Stability is assured despite small ratio errors by the shunting effect of the resistor 11 (d.c. stability) and the capacitor 10 (a.c. stability).

As shown in FIG. 2, the transistor 1 is also provided with a shunt-current feedback arrangement that functions in the same manner as that described for the transistor 2. The shunt-current feedback arrangement for the transistor 1 includes NPN bipolar transistors 36,37 connected to P-channel enhancenent mode field effect transistors 38,39.

Figure 3:
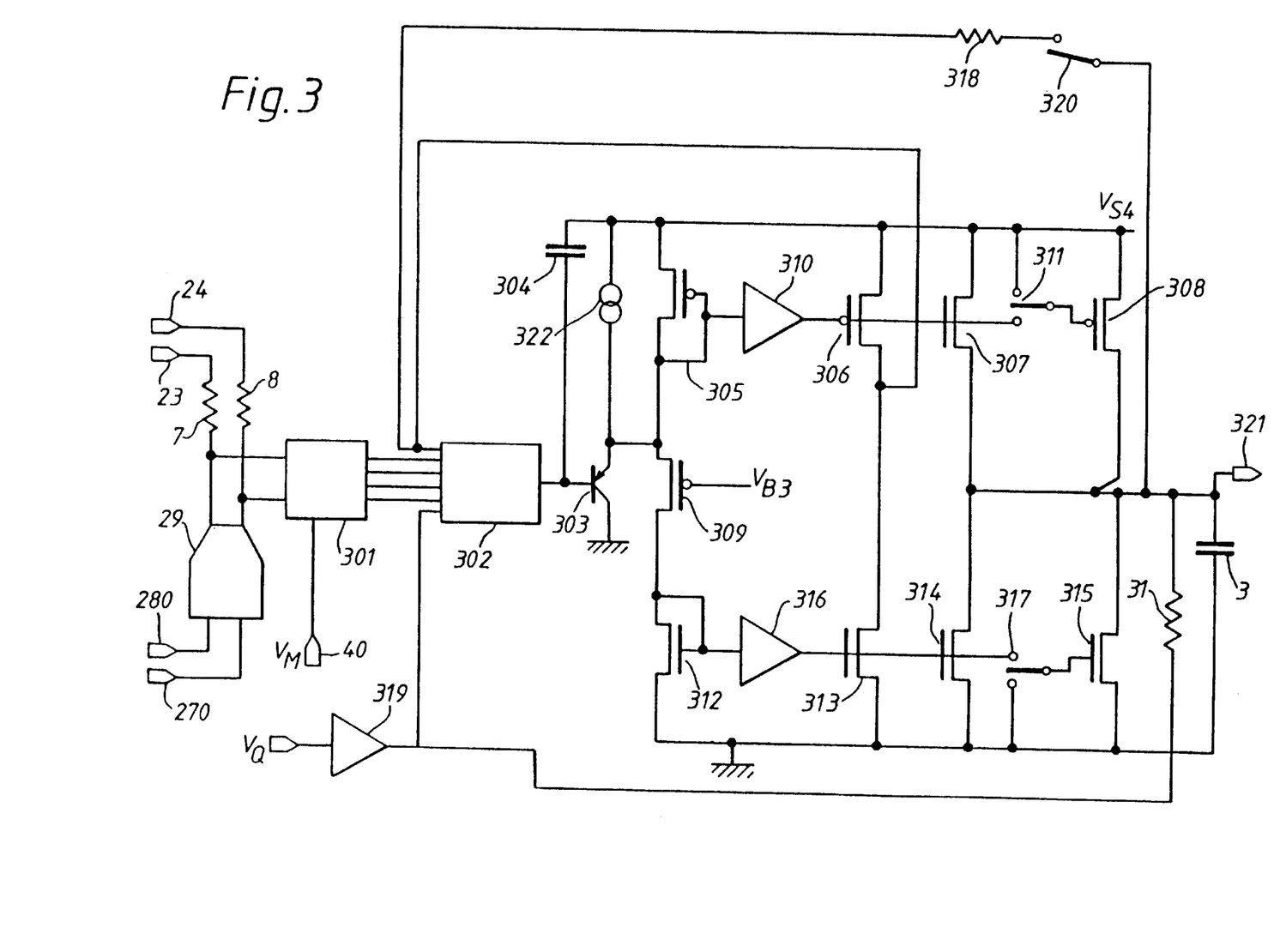
FIG. 3 is a diagrammatic representation of the current amplifier.

Referring to FIG. 3 of the accompanying drawings, the voltage-to-current converter 29 is shown connected to the resistors 7,8 and the voltage cancellation circuit 6 of FIG. 2 is shown in greater detail than in FIG. 2.

The voltage cancellation circuit 6 includes a differential-current buffer circuit 301, a current-summing buffer circuit 302, a PNP bipolar transistor 303, a current source 322, five P-channel enhancement mode field effect transistors 305 to 309, four N-channel enhancement mode field effect transistors 312 to 315, three unity-gain voltage amplifiers 310,316, 319, three switch elements 311,317,320, two resistors 31,318 and a capacitor 304. The capacitor 3 shown in FIGS. 1 and 2 is shown connected to the output terminal 321 of the voltage cancellation circuit 6.

The PNP transistor 303, the current source 322, the P-channel enhancement mode transistors 305,309 and the N-channel enhancement mode transistor 312 form a voltage-amplifying stage having the base terminal of the transistor 303 as an input terminal and the gate terminals of the transistors 305,312 as the output terminals.

The differential-current buffer circuit 301 has differential-input terminals connected to the resistors 7,8 and to differential-output terminals of the voltage-to-current converter 29. The differential-current buffer circuit 301 has a plurality of output terminals connected to respective input terminals of the current-summing buffer circuit 302 the output terminal of which is connected to the base electrode of the transistor 303. The collector electrode of the transistor 303 is connected to the earth potential for the circuit and the emitter electrode of the transistor 303 is connected to the drain electrode of the transistor 305. The current source 322 is connected to the emitter electrode of the transistor 303 and the source electrode of the transistor 305. The capacitor 304 is connected between the base electrode of the transistor 303 and the drain electrode of the transistor 305. The drain electrode of the transistor 305 is connected to its gate electrode and to an input terminal of the unity-gain voltage amplifier 310, an out terminal of the amplifier 310 being connected to the gate electrodes of the transistors 306,307 and one fixed terminal of the switch element 311. The source electrodes of the transistors 305 to 307 are all connected to the positive terminal of a voltage source $V_{S4}$ and the drain electrodes of the transistors 306,307 are connected to the respective drain electrodes of the transistors 313,314. The drain electrode of the transistor 305 is connected to the source electrode of the transistor 309 and the drain electrode of the transistor 309 is connected to the drain electrode of the transistor 312. The drain electrode of the transistor 312 is connected to its gate electrode and to an input terminal of the unity-gain buffer amplifier 316 an output terminal of which is connected to the gate electrodes of the transistors 313,314 and one fixed terminal of the switch element 317. The source electrodes of the transistors 312 to 314 are all contacted to the earth potential terminal of the voltage source $V_{S4}$. The switch element 311 has a moving contact connected to the gate electrode of the transistor 308, the switch element 317 has a moving contact connected to the gate electrode of the transistor 315, the drain electrodes of the transistors 308,315 being connected together and to the drain electrodes of the transistors 307,314. Another fixed terminal of the switch element 311 is connected to the positive terminal of the voltage source $V_{S4}$ and another fixed terminal of the switch element 317 is connected to the earth potential terminal of the voltage source $V_{S4}$.

The common connection point of the drain electrodes of the transistors 307,308,314,315 is connected to the output terminal 321 of the voltage cancellation circuit 6. The common connection point of the drain electrodes of the transistors 307,308,314,315 is connectible, by way of the switch element 320, to a further input terminal of the buffer circuit 302 and the connection path includes the resistor 318.

The common connection point of the drain electrodes of the transistors 306,313 is connected to the further input terminal of the current-summing buffer circuit 302 and yet another input terminal of the current-summing buffer circuit 302 is connected to an output terminal of the unity-gain voltage amplifier 319 which is provided with an input signal voltage $V_Q$. The resistor 31 connects the output terminal of the unity-gain voltage amplifier 319 to the output terminal 321 of the voltage cancellation circuit 6. The differential-current buffer circuit 301 is provided with an input signal voltage $V_M$ and a bias voltage $V_{B3}$ is applied to the gate electrode of the transistor 309. The differential input terminals of the voltage-to-current converter 29 are shown as 270,280, those terminals being connected to the resistors 27,28 as shown in FIG. 2.

In the circuit as shown in FIG. 3, a differential signal voltage applied to the input terminals 270,280 is converted into a differential signal current by the voltage-to-current converter 29 and the signal current from the voltage-to-current converter 29 is added to signal current supplied through the resistors 7,8 from the terminals 23,24. The added currents enter the differential-current buffer circuit 301 by way of its complementary input terminals which the differential-current buffer circuit 301 maintains at a voltage of $V_M$ as a means of countering common mode signals from the circuit elements connected to its input terminals. The differential-current buffer circuit 301 has unity current gain and the signal current passes to the current-summing buffer circuit 302 from the differential-current buffer circuit 301. The differential-current buffer circuit 301 includes an input terminal 40 to which the input signal voltage $V_M$ is applied.

The output signal current from the differential-current buffer circuit 301 is added internally in the current-summing buffer circuit 302 to a signal current fed back from the common connection of the drain electrodes of the transistors 306,313 applied to an input terminal of the current-summing buffer circuit 302 which has a relatively low input impedance and is biassed to a voltage of about $V_Q$ volts provided by the unity-gain voltage amplifier 319. The signal current from the current-summing buffer circuit 302 drives the transistor 303 for which the current source 322 with the transistors 305,309,312 act as an emitter load (the transistor 303 being connected as an emitter follower), the voltages developed across the transistors 305,312 passing as signal voltages to the unity gain voltage amplifiers 310,316. The output signal voltage from the unity-gain voltage amplifier 310 drives the gate electrodes of the transistors 306,307 while the output signal voltage from the unity-gain voltage amplifier 316 drives the gate electrodes of the transistors 313,314. The d.c. conditions are such that the transistors 306,313 serve as a first class-AB output stage. The transistors 307,314 are connected to serve as a second class-AB output stage similar to the first class-AB output stage. The transistors 306,313 serve as a reference output stage and provide current to one of the input terminals of the current-summing buffer circuit 302 while the transistors 307,314 serve as an actual output stage and provide current to the output terminal 321. An additional class-AB output stage is present in the form of the transistors 308,315 the gate electrodes of which are connectible by way of switch elements 311,317 to the output terminals of the unity-gain voltage amplifiers 310,316 for providing enhanced current drive to the output terminal 321.

Class-AB operation of the transistors 306 to 308 and 313 to 315 is achieved by so setting the bias voltage $V_{B3}$ as to cause a common quiescent current to flow from the transistor 305 to the transistors 309,312. The voltage conditions established at the gate electrodes of the transistors 305,312 when they conduct equal currents are then transferred to the gate electrodes of the transistors 306 to 308 and 313 to 315. The transistors 306,307,313,314 provide unity current amplification relative to the transistors 305,312 and the transistors 308,315 provide about X50 current amplification relative to the transistors 305,312.

In operation, an increase in the base voltage of the transistor 303 results in a decrease in the current flowing through the transistor 303 and the transistor 305, current from the current source 322 then flowing into the transistors 309,312. The gate voltages of the transistors 305,312 then modulate the currents in the transistors 306 to 308 and 313 to 315 in their respective current ratios, with peak output currents significantly greater than the quiescent current. A decrease in the base voltage of the transistor 303 results in an effect in the transistors 306 to 308 and 313 to 315 that is opposite to that resulting from an increase in that base voltage. A difference between the output current of the transistors 306,313 and the sum of the other currents supplied to the current-summing buffer circuit 302 leads to a change in the voltage at the output terminal of the current-summing buffer circuit 302. The output terminal of the current-summing buffer circuit 302 is connected to the base electrode of the transistor 303 which responds to the change in its base voltage by changing its output current. The output current of the transistor 303 controls the output current of the transistors 306,313, the change in the output current of the transistor 303 being in such a sense as to remove the difference between the output current of the transistors 306,313 and the sum of the other currents supplied to the current-summing buffer circuit 302. The capacitor 304 serves to provide a dominant pole stabilising the feedback loop.

The output current of the transistors 307,314 is substantially equal to that of the transistors 306,313 and is equal and opposite to that supplied by the differential-current buffer circuit 301 to the current-summing buffer circuit 302. When the transistors 308,315 are connected into the circuit its total current output is the current output of the transistors 306, 313,308,315, providing a current gain of 51 relative to the input current to the current-summing buffer circuit 302. The open-loop gain-bandwidth product of the inner-control loop that includes the transistors 306,313 depends on the value of the capacitor 304 and the effective transconductance of the transistors 305,309.

The resistor 31 connected between the output port of the amplifier 319 and the terminal 321 serves to define the transresistance of the circuit driven by the differential-current buffer circuit 301; since the differential-current buffer circuit 301 provides unity current gain, the transresistance of the overall circuit between the input terminals of the differential-current buffer circuit 301 and the terminal 321 is the same as the transresistance of the circuit driven by the differential-current buffer circuit 301. The transresistance of the overall circuit including the differential-current buffer circuit 301 determines the voltage excursion at the terminal 321, the transresistance being a measure of the voltage excursion at the terminal 321 per unit of current delivered to the terminals of the differential-current buffer circuit 301. The arrangement disclosed herein serves to stabilise the low-frequency gain of the voltage cancellation circuit 6 in order to avoid output transients as the transistors 308,315 are switched into and out of circuit.

The current gain of the circuit is unity with the switches 311,317,320 in their open condition and the output voltage excursion at the terminal 321 is determined by the value of the resistor 31. That voltage excursion would change when the switches 311,317 are closed since the transistors 308,315 deliver an additional output current of 50 times the input current and that would be equivalent to a change in the transresistance of the circuit. The introduction of the resistor 318 into the circuit by closing the switch 320 serves to re-establish the transresistance of the circuit at its original value and switching between low and high current gains is achieved without any significant change in the voltage excursion at the terminal 321.

The end of the resistor 318 connected to the current-summing buffer circuit 302 is held at substantially the same voltage VQ as one end of the resistor 31, the relevant input port of the current-summing buffer circuit 302 being a low-impedance point that is the junction of the emitter electrodes of two transistors; the junction of the transistors 306,313 is connected to the same low-impedance point in the current-summing buffer circuit 302.

The voltage $V_Q$ is the estimated voltage for the base electrode of the transistor 1 of FIG. 1 to which the terminal 321 is connected. The arrangement disclosed herein serves to establish a voltage VQ at the terminal 321 for the condition of zero signal input current into the differential-current buffer circuit 301, that condition coinciding with there being zero signal output voltage and current at the terminal 321 and zero signal voltage at the terminals 23,24 and the terminals 270,280. In that way, the voltage cancellation circuit has only to correct for departures from the estimated voltage across the element 100 of FIG. 1 and not the actual voltage across that element. The arrangement disclosed herein is especially important in cases where the feedback gain is relatively low since, in that situation, conditions are provided in which a low quiescent voltage is required at the terminals 23,24 to drive the loop.

In the arrangement shown in FIG. 3, the transistors 306,313 function as reference output current generators and the transistors 307,314 function as the actual output current generators. The unity-gain voltage amplifiers 310,316 could be dispensed with, their function, in this case, being to serve as wideband buffer stages between the transistors 305,312 and the transistors 306,313,307, 314 and, when switched in, the transistors 308,315. Dispensing with the unity-gain voltage amplifiers 310,316 would result in reduced performance for the system but would not make it inoperative. The bipolar transistor 303 could be replaced by an enhancement mode field-effect transistor connected as a source follower.

Figure 4:
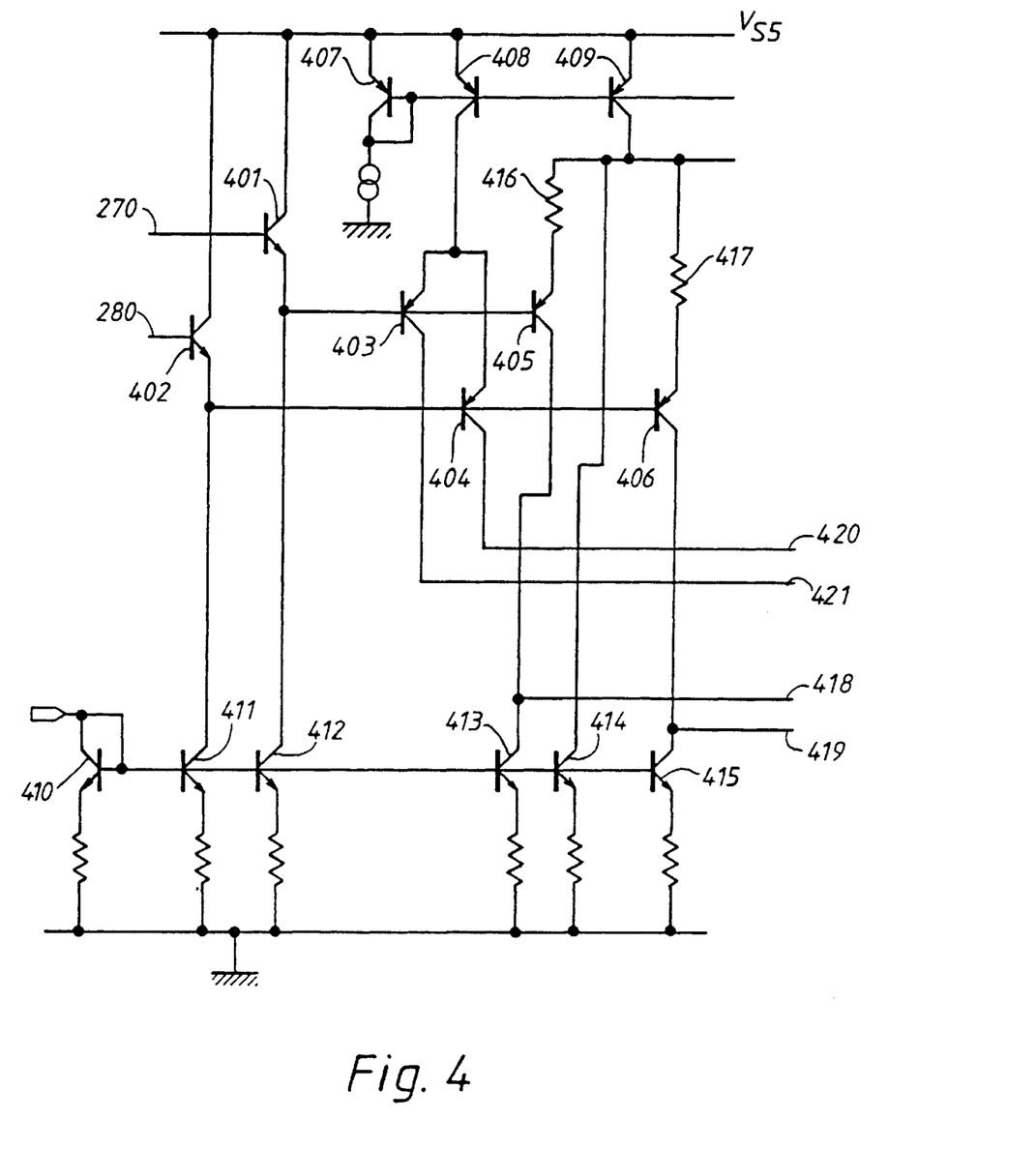
FIG. 4 is a diagrammatic representation of an input stage of the amplifier of FIG. 1

Referring to FIG. 4 of the accompanying drawings, the voltage-to-current converter 29, shown in FIGS. 2,3, includes PNP bipolar transistors 405 to 407 and 409 and NPN bipolar transistors 413 to 415 with a plurality of associated resistors. The voltage-to-current converter is shown as receiving its input voltage signal from NPN bipolar transistors 401,402 belonging to the output stage of the intermediate voltage amplifying circuit 4 shown in FIG. 1, the transistors 401,402 being provided with emitter loads including NPN bipolar transistors 410 to 412 with respective emitter resistors. The voltage-to-current converter is shown as having output terminals 418,419 and the transistors 401,402 provide input terminals 270,280. FIG. 4 also shows PNP bipolar transistors 403,404,408 which belong to the output stage of the intermediate voltage amplifying circuit 4 having output terminals 420,421.

The transistors 410 to 412 and the respective emitter resistors serve as a current sink and as an emitter load for the transistors 401,402 which serve as emitter followers driving the transistors 405,406. The transistors 405,406 are provided with respective emitter resistors 416,417 which serve to convert input signal voltages to signal currents, the transistors 409,413 to 415 and the respective emitters resistors acting as current sources biassing the transistors 405,406. The signal currents generated in the transistors 405,406 appear as output currents at the output terminals 418,419. Output signals are developed by the transistors 403,404 which operate with the associated current source transistor 408 and those output signals appear at the output terminals 420,421 which apply them to the output voltage amplifying circuit 5 shown in FIGS. 1 and 2.

The voltage-to-current converter circuit could be considered to form a part of the output stage of the intermediate voltage amplifying circuit 4 or, alternatively, could be a part of the input stage of the voltage cancellation circuit 6.

Figure 5:
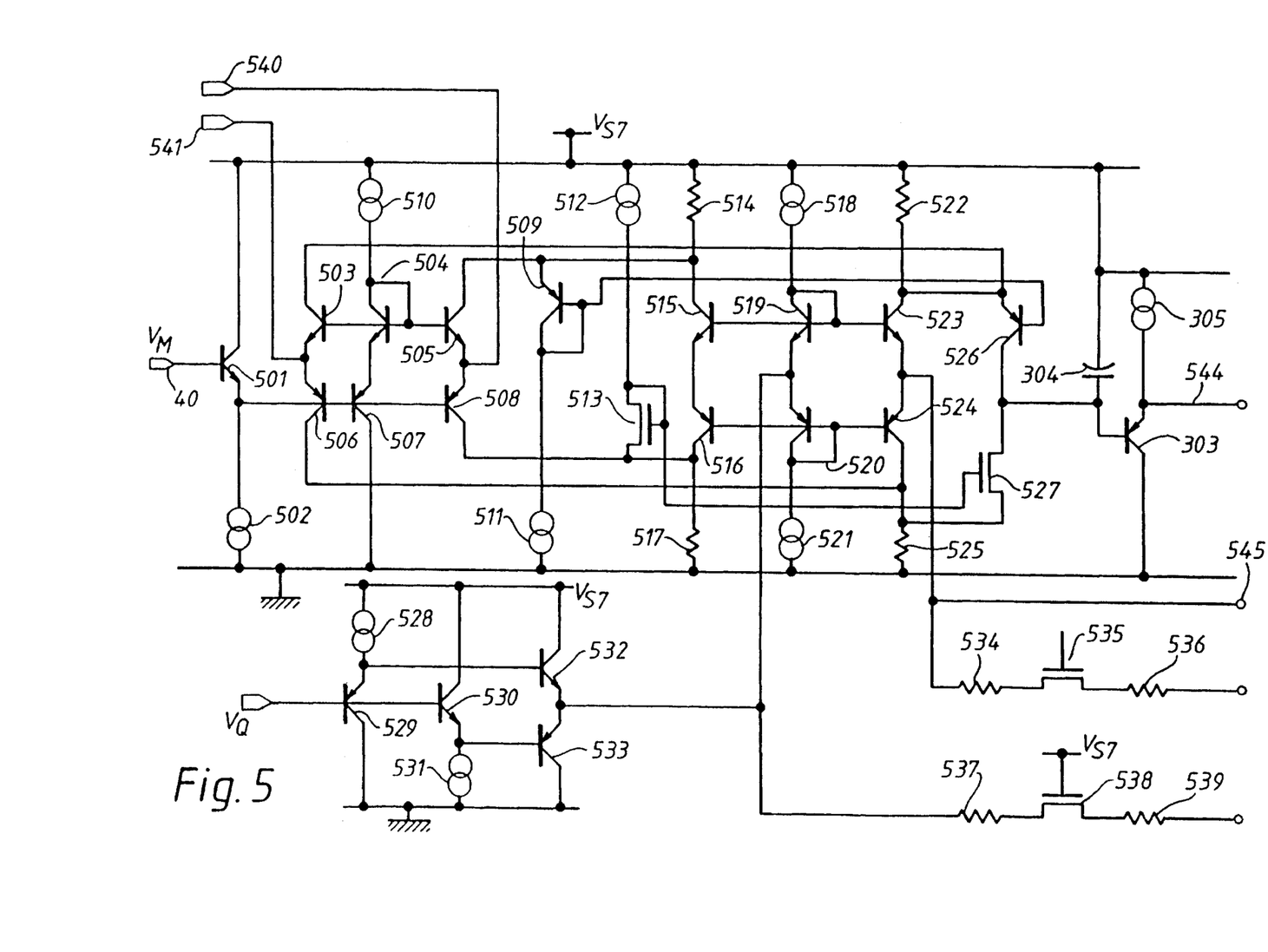
FIG. 5 is a diagrammatic representation of the input stage of the current amplifier of FIG. 3.

Referring to FIG. 5 of the accompanying drawings, the differential-current buffer circuit 301, the current-summing buffer circuit 302 and the unity gain voltage amplifier 319 of FIG. 3 are shown in more detail than they are shown in FIG. 3.

FIG. 5 shows the differential-current buffer circuit as including NPN bipolar transistors 501,503 to 505, PNP bipolar transistors 506 to 508 and current sources 502,510. The current-summing buffer circuit is shown as including an N channel enhancement mode field effect transistor 513 and resistors 514,517, the NPN bipolar transistors 515,519,523, the PNP bipolar transistors 509,516,520,524,526, the current sources 511,512,518,521, an N channel enhancement mode field effect transistor 527 and resistors 522,525. The unity gain voltage amplifier is shown as including the NPN bipolar transistors 530,532, the PNP bipolar transistors 529, 533 and the current sources 528,531.

The base electrode of the transistor 501 is connected to an input terminal 40 of the differential-current buffer circuit, the emitter electrode of the transistor 501 is connected to the current source 502 and to the base electrodes of the transistors 506 to 508, the collector electrode of the transistor 501 being connected to the positive terminal of a supply voltage source $V_{S7}$. The emitter electrode of the transistor 506 is connected to the emitter electrode of the transistor 503 and to input terminal 541 of the differential-current buffer circuit. The collector electrode of the transistor 503 is connected to the emitter electrode of the transistor 526 to the collector electrode of the transistor 523 and to the resistor 522. The collector electrode of the transistor 506 is connected to the source electrode of the transistor 527, to the collector electrode of the transistor 524 and to the resistor 525. The base electrode of the transistor 503 is connected to the base electrodes of the transistors 504,505 and the emitter electrodes of the transistors 505,508 are connected together and to input terminal 540 of the differential-current buffer circuit. The collector electrode of the transistor 505 is connected to the emitter electrode of the transistor 509, to the collector electrode of the transistor 515 and to the resistor 514. The collector electrode of the transistor 508 is connected to the source electrode of the transistor 513, to the collector electrode of the transistor 516 and to the resistor 517, the emitter electrodes of the transistors 515,516 being connected together. The collector electrode of the transistor 504 is connected to its base electrode and to the current source 510 and the emitter electrode of the transistor 504 is connected to the emitter electrode of the transistor 507 which has its collector electrode connected to the reference voltage terminal of the voltage source $V_{S7}$.

The base electrode of the transistor 509 is connected to its collector electrode, to the base electrode of the transistor 526 and to the current source 511. The gate electrode of the transistor 513 is connected to its drain electrode, to the current source 512 and to the gate electrode of the transistor 527.

The base electrode of the transistor 515 is connected to the base electrodes of the transistors 519,523, the collector electrode of the transistor 519 is connected to its base electrode and to the current source 518, the emitter electrodes of the transistors 519,520 being connected together. The base electrode of the transistor 516 is connected to the base electrodes of the transistors 520,524 while the collector electrode of the transistor 520 is connected to its base electrode and to the current source 521. The collector electrode of the transistor 526 is connected to the drain electrode of the transistor 527 and provide an output terminal.

The emitter electrodes of the transistors 523,524 are connected together. The emitter electrodes of the transistors 523,524 are connected to resistors 534,536 and to a switch transistor 535 serving as the current-feedback components 318,320 shown in FIG. 3. The emitter electrodes of the transistors 523,524 are connected to a terminal 545 which is connected to the drain electrodes of the transistors 306,313 shown in FIG. 3. The emitter electrodes of the transistors 519,520 are connected to a series network of two resistors 537,539 and a transistor 538 serving as the resistor 31 shown in FIG. 3. The positive terminal of the voltage source $V_{S7}$ is connected to the terminals of the current sources 510,512, 518 and the resistors 514,522 remote from wry the respective transistors to which they are connected. The negative terminal of the voltage source $V_{S7}$ is connected to the terminals of the current sources 502,511,521 and the resistors 517,525 remote from the respective transistors to which they are connected.

As shown in FIG. 5, in the voltage amplifier, the emitter electrode of the transistor 529 is connected to the current source 528 and to the base electrode of the transistor 532. The base electrode of the transistor 529 provides an input terminal of the unity gain voltage amplifier and is connected to the base electrode of the transistor 530. The emitter electrode of the transistor 530 is connected to the current source 531 and to the base electrode of the transistor 533, the emitter electrodes of the transistors 532,533 being connected together and to the common connection of the emitters of the transistors 519,520. The unity gain amplifier is energised by the voltage source $V_{S7}$ the positive terminal of which is connected to the collectors of the transistors 530,532 and to the terminal of the current source 528 remote from the transistor 529. The negative terminal of the voltage source is connected to the collector electrodes of the transistors 529, 533 and to the terminal of the current source 531 remote from the transistor 530.

The differential-current buffer circuit is capable of accepting differential input signal currents on its input terminals 540,541.

Signal current drawn out of the emitter electrodes of the transistors 503,506 through the input terminal 541 leads to a decrease in current flowing through the transistor 506, causing a decrease in current flowing through the resistor 525 and leading to a reduction in the voltage drop across the resistor 525 which, in turn, reduces the voltage at the source electrode of the transistor 527 and leads to an increase in the current flowing through the transistor 527. At the same time, the signal current drawn out of the emitter electrodes of the transistors 503,506 through the input terminal 541 leads to an increase in current through the transistor 503, causing an increase in current through the resistor 522 and leading to an increase in the voltage drop across the resistor 522 which, in turn, reduces the voltage at the emitter electrode of the transistor 526 and leads to a decrease in the current flowing through the transistor 526. The combined effect of the increase in current flowing in the transistor 527 and the decrease in current flowing in the transistor 526 is an increase in the current flowing out of the base electrode of the transistor 303.

Signal current injected into the emitter electrodes of the transistors 505,508 through the input terminal 540 leads to a decrease in current flowing through the transistor 505, causing a reduction in the voltage drop across the resistor 514 and an increase in the voltage at the emitter electrode of the transistor 509 which, in turn, leads to an increase in the voltage at the emitter electrode of the transistor 526 and a decrease in the current flowing through the transistor 526. At the same time, the signal current injected into the emitter electrodes of the transistors 505,508 through the input terminal 540 leads to an increase in current flowing through the transistor 508, causing an increase in the current flowing through the resistor 517 and a rise in the voltage drop across the resistor 517 which, in turn, increases the voltage at the source electrode of the transistor 513 and leads to a rise in the voltage at the gate electrode of the transistor 527 which results in an increase in the current flowing through the transistor 527.

It is evident from the analysis set out above that the injection of signal current into the input terminal 540 has the same effect as the extraction of current from the input terminal 541 and that, further, common-mode input signal currents are converted into output currents which tend to cancel each other.

The current source 510 and the transistors 504,507 serve as a current-bias network for the transistors 503,505,506, 508. The transistor 501 serves as an emitter follower allowing the adjustment of the bias condition of the transistors 503,505,506,508 by the input voltage $V_M$ so that the quiescent voltage of 540,541 is set to about $V_M$ with a low source impedance.

The emitter electrodes of the transistors 519,520 transmit the output voltage from the transistors 532,533 through their base-emitter junctions to maintain the quiescent voltage of the emitters of the transistors 523,524 at about VQ volts. The transistors 519,520 in conjunction with the current sources 518,521 also set the quiescent current of the transistors 523,524 and 515,516. The emitter electrodes of the transistors 523,524 act as a low-impedance input terminal, biassed to a voltage VQ, into which is fed the feedback signal from the transistors 306,313 of FIG. 3 through a terminal 545 or from the transistors 308,315 of FIG. 3.

More specifically, the voltage at the emitters of the transistors 532,533 is $V_Q - V_{be(530)} + V_{be(533)}$ or $V_Q + V_{be(529)} - V_{be(532)}$ where $V_{be(530)}$, $V_{be(532)}$, $V_{be(533)}$ and $V_{be(529)}$ are the respective base-emitter voltage offsets of the transistors 530,532,533 and 529. Ideally, the the base-emitter voltage drops of the transistors 529,530,532,533 are equal and the voltage at the emitters of the transistors 532,533 is equal to $V_Q$. The quiescent current is set by $V_{be(532)} + V_{be(533)}$ which is equal to $V_{be(529)} + V_{be(530)}$ and is set by respective current sources for the transistors 529,530. The peak current available from the transistors 532,533 is much greater than the quiescent current.

The input terminals 540,541 of FIG. 5 are connected to the terminals 418,419 of FIG. 4. The components 534 to 536 of FIG. 5 are equivalent to the components 318,320 of FIG. 3 and the components 537 to 539 of FIG. 5 are represented by a resistor 31 in FIG. 3. The emitter electrodes of the transistors 519,520 of FIG. 5 serve as the voltage setting input terminal of the current-summing buffer circuit 302 connected to the output terminal of the unity gain voltage amplifier 319 as shown in FIG. 3.

A further input differential current could be applied to the common emitter electrodes of the transistors 515,516 and 523,524 through additional input terminals in a similar way to that in which input currents are applied to the transistors 503,506 and 505,508 through the input terminals 540,541. The quiescent voltage of the additional input terminals would be VQ rather than VM.

A substantial number of the devices identified above are replaceable by complementary devices and field. effect devices replaceable by bipolar devices, and vice-versa.

I claim:

1. An amplifier including:
   a current generator (13 to 19), connected to one of its input ports (20,21) for, in operation, injecting a current into a load which is connected to the said input port (20,21) of the amplifier,
   a frequency-selective amplifying circuit (1 to 4,10) connected to the said input port (20,21), the frequency-selective amplifying circuit (1 to 4,10), in operation, amplifying input signals excluding the injected current present at the said input port (20,21) and
   a voltage cancellation circuit (6) connected within the frequency-selective amplifying circuit (1 to 4,10), the voltage cancellation circuit (6), in operation, opposing a condition of imbalance within the frequency-selective amplifying circuit (1 to 4,10) attributable to the injected current,
   characterised in that the current generator (13 to 19) includes a network of transistor current mirrors (13 to 17) which, in operation, supply a first current to a first terminal (20) and sink a second current at a second terminal (21) of the input port (20,21), the first and second currents being unequal.

2. An amplifier as claimed in claim 1, wherein the relative dimensions of the transistor current mirrors (13 to 17) establish the current ratios existing in the network of transistor current mirrors (13 to 17).

3. An amplifier as claimed in claim 2, wherein the network of transistor current mirrors (13 to 17) includes a first transistor current mirror (13,17), a second transistor current mirror (15, 17) and a third transistor current mirror (14,16), the third transistor current mirror (14,16) being connected to receive current from the first transistor current mirror (13, 17), the second and third transistor current mirrors (15, 17;14,16), in operation, providing the first and second currents.

4. An amplifier as claimed in claim 1, wherein the voltage cancellation circuit (6) is connected to respond, in operation, to a d.c. output voltage from the frequency-selective amplifying circuit (1 to 4,10) and to apply a signal to an input element of the frequency-selective amplifying circuit (1 to 4,10) in such a sense as to drive the d.c. output voltage of the frequency-selective amplifying circuit (1 to 4, 10) towards zero volts.

5. An amplifier as claimed in claim 1, wherein the voltage cancellation circuit (6) operates initially with a first bandwidth and a first gain and, subsequently, with a second bandwidth which is narrower than the first bandwidth and a second gain which is substantially equal to the first gain.

6. An amplifier as claimed in claim 1, wherein the voltage cancellation circuit (6), in operation, responds to a first operating-voltage at a low level and a second operating-voltage at a high level in the frequency-selective amplifying circuit (1 to 4,10) and applies a signal to an input element of the frequency-selective amplifying circuit (1 to 4,10) in a sense such as to oppose a departure of the first and second operating voltages from selected values.

7. An amplifier as claimed in claim 1, wherein the voltage cancellation circuit (6) includes a current-amplifier output stage which, in operation, maintains an input d.c. voltage at an input element of the frequency-selective amplifying circuit (1 to 4,10) for opposing the effect of the injected current.

8. An amplifier as claimed in claim 1, wherein the voltage cancellation circuit (6) includes a voltage-amplifier output stage connected in series with a current-setting resistor for maintaining an input d.c. voltage at an input element of the frequency-selective amplifying circuit (1 to 4,10) for, in operation, opposing the effect of the injected current.

9. An amplifier as claimed in claim 1, wherein a capacitor (3) is connected to a port of the voltage-cancellation circuit (6) and determines the bandwidth of the voltage-cancellation circuit (6).

10. An amplifier as claimed in claim 1, wherein the frequency-selective amplifying circuit (1 to 4,10) includes a differentially-connected bipolar transistor input stage so connected as to operate in a common-base configuration over the frequency range of the frequency-selective amplifying circuit (1 to 4,10).

11. An amplifier as claimed in claim 10, wherein one transistor of the differentially-connected input stage is provided with a fixed base voltage bias and the base voltage bias of the opposing transistor of the differentially-connected input stage is provided by the voltage cancellation circuit (6).

12. An amplifier as claimed in claim 10 or 11, wherein the differentially-connected input stage includes current-feedback circuits for increasing the base input impedances of the transistors.

13. An amplifier as claimed in claim 1, wherein the voltage cancellation circuit (6) includes a current amplifier including:
   an input current-summing stage (301,302) having a first low-impedance input port,
   a voltage-amplifying stage (303,304,322,305,309,312) including an input port connected to an output port of the current-summing stage (301,302),
   a reference stage (306,313) including an output port which is connected to a second low-impedance input port of the current-summing stage (301,302) and
   an output stage (307,308,314,315) which is connected to be driven by the voltage-amplifying stage (303,304, 322,305,309,312), the output stage (307,308,314,315) being connected in parallel with the reference stage (306,313), the output currents of the output and reference stages being in a fixed ratio to each other as determined by the elements of the output stage (307, 308,314,315) and the reference stage (306,313).

14. An amplifier as claimed in claim 13, in which a resistor connected from an output port of the voltage-amplifying stage (303,304,322,305,309,312) to a reference point defines the transresistance of the current amplifier.

15. An amplifier as claimed in claim 13, in which a resistor connected from an output port of the voltage-amplifying stage (303,304,322,305,309,312) to a further low-impedance input port of the current-summing stage (301,302) defines the transresistance of the current amplifier.

16. An amplifier as claimed in claim 13, including a first output stage (307,314) which has a first current gain and a second output stage (308,315) with input and output ports connectible in parallel with respective input and output ports of the first output stage (307,314) by means of switch elements (311,317), the second output stage (308,315) having a current gain exceeding that of the first output stage (307,314).

17. An amplifier as claimed in claim 16, including a further resistor (318) connectible by a further switch element (320) between the second output stage (308,315) and a further low-impedance input port of the current-summing stage (301,302) when the second output stage (308,31) is in operation, the value of the further resistor (318) being such as to maintain the same transresistance of the current amplifier when the second output stage (308,315) is in operation as in other configurations.

18. An amplifier as claimed in claim 13, wherein the reference and output stages include respective complementary pairs of field-effect transistors, connected in push-pull, so coupled to the voltage-amplifying stage (303,304,322, 305,309,312) as to be biassed in class AB.

19. An amplifier as claimed in claim 18, wherein the voltage-amplifying stage (303,304,322,305,309,312) includes a further complementary pair of field-effect transistors (305,312), with gate terminals connected to the respective gate terminals of the transistors in the reference and output stages and source terminals connected to the respective source terminals of the transistors in the reference and output stages.

20. An amplifier as claimed in claim 19, wherein the voltage-amplifying stage (303,304,322,305,309,312) includes an input voltage buffer (303,322) connected to drive current into a network of field effect transistors (305, 309,312) including the further complementary pair of field-effect transistors.

21. An amplifier as claimed in claim 20, wherein the input voltage buffer (303,322) includes an input bipolar transistor (303) connected as an emitter follower for driving current into the network of field effect transistors.

22. An amplifier as claimed in claim 18, wherein the field-effect transistors are enhancement mode devices.

23. An amplifier as claimed in claim 13, including a pair of output field effect transistors with gate terminals connected to the respective gate terminals of field effect transistors included in the reference stage and source terminals connected to the respective source terminals of the field-effect transistors included in the reference stage, for providing an input current exceeding that available from a first output stage.

* * * * *